United States Patent [19]

Howlett

[11] 4,106,010
[45] Aug. 8, 1978

[54] LOGARITHMIC ANALOG-TO-DIGITAL CONVERTER

[75] Inventor: Donald L. Howlett, Houston, Tex.

[73] Assignee: Texaco Inc., New York, N.Y.

[21] Appl. No.: 683,450

[22] Filed: May 5, 1976

[51] Int. Cl.² .......................................... H03K 13/02
[52] U.S. Cl. ........................................... 340/347 AD
[58] Field of Search .............. 340/347 AD, 15.5 GC; 325/38 R

[56] References Cited

U.S. PATENT DOCUMENTS

| Re. 23,579 | 11/1952 | Pierce | 325/38 R |
| 2,592,308 | 4/1952 | Meacham | 340/347 AD |
| 3,264,637 | 8/1966 | Parkinson | 340/347 AD |
| 3,444,550 | 5/1969 | Paulus | 340/347 AD |
| 3,742,489 | 6/1973 | Lefevre | 340/347 AD |
| 3,882,484 | 5/1975 | Brokaw | 340/347 AD |

*Primary Examiner*—Charles D. Miller
*Attorney, Agent, or Firm*—Thomas H. Whaley; Carl G. Ries; Ronald G. Gillespie

[57] ABSTRACT

A received analog input signal is applied to a programmable amplifier. The amplifier is controlled by digital signals and by preselected gain of its individual stages to provide an analog signal corresponding to the received input signal. The digital signals are provided by digital signal means in accordance with the analog signal from the programmable amplifier and as such correspond to the logarithm of the received input signal.

4 Claims, 2 Drawing Figures

LOGARITHMIC ANALOG-TO-DIGITAL CONVERTER

BACKGROUND OF THE INVENTION

Field of the Invention

The apparatus of the present invention relates to converters in general and, more particularly, to an analog-to-digital converter.

SUMMARY OF THE INVENTION

A logarithmic analog digital converter includes a programmable amplifier adapted to receive an analog input signal. The programmable amplifier is responsive to digital signals for providing an analog output corresponding to a received analog signal. The digital signals are provided by a digital signal network, which also provides them as the digital output corresponding logarithmically to the received analog signal, in accordance with the analog output from the programmable amplifier.

The objects and advantages of the invention will appear more fully hereinafter, from a consideration of the detailed description which follows, taken together with the accompanying drawings wherein one embodiment is illustrated by way of example. It is to be expressly understood, however, that the drawings are for illustrative purposes only and are not to be constructed as defining the limits of the invention.

DESCRIPTION OF THE INVENTION

Figure 1:
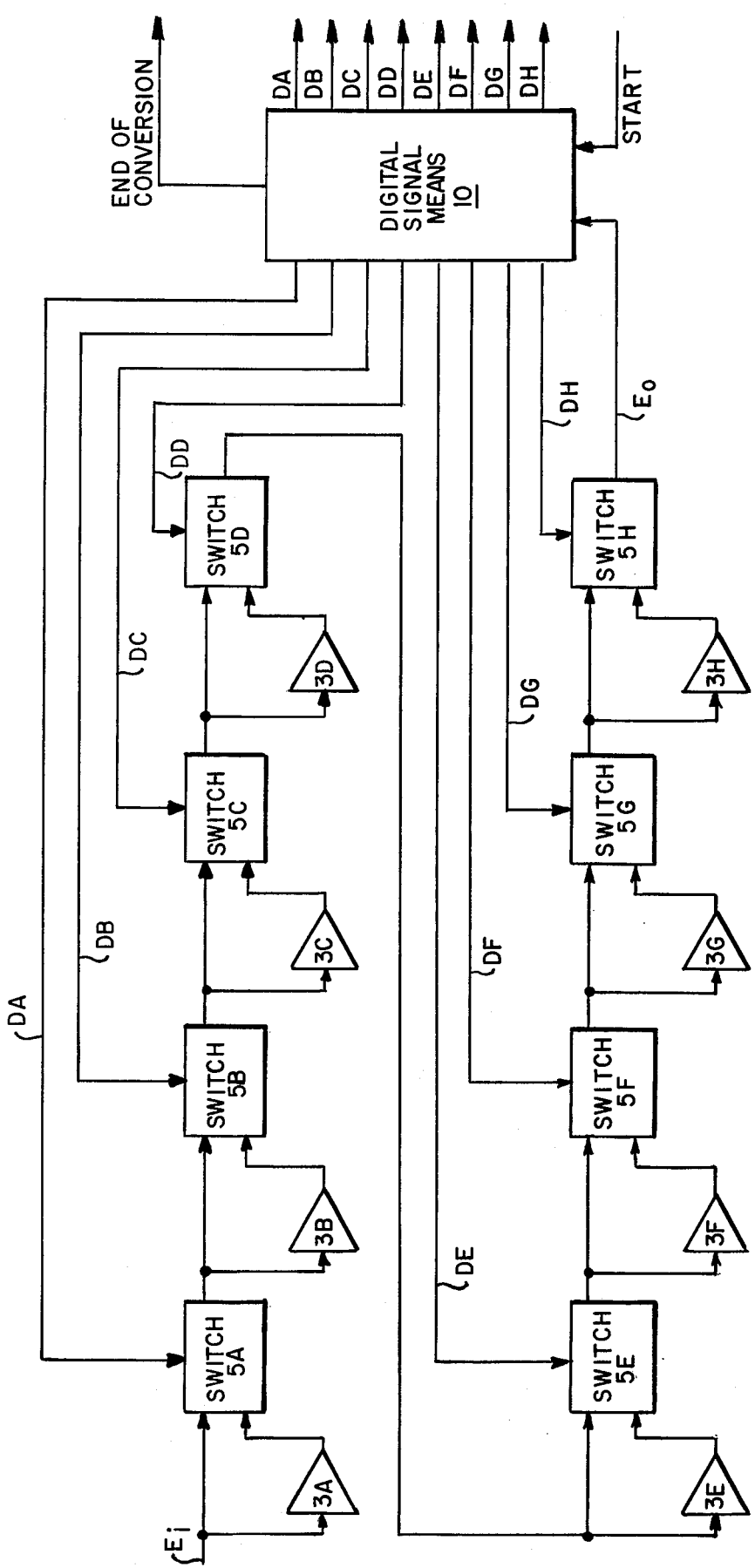
FIG. 1 is a simplified block diagram of a logarithmic analog-to-digital converter, constructed in accordance with the present invention.

Referring to FIG. 1, amplifiers 3A through 3H, in cooperation with switches 5A through 5H, comprise a programmable amplifier. Amplifiers 3A through 3H have predetermined gains as follows: 1, 256, 16, 4, 2, 1.414, 1,189 and 1.0905 or as expressed in powers of two: $2^0$, $2^8$, $2^4$, $2^2$, $2^1$, $2^{1/2}$, $2^{1/4}$ and $2^{1/8}$. It should be noted that amplifier 3A, having a gain of unity, is used to invert a negative signal to a positive signal and as such may be located either as the input amplifier of the programmable amplifier or as the output amplifier; it is shown in this particular embodiment as the input amplifier. Amplifier 3A has an analog input signal $E_1$ applied to its input.

Figure 2:
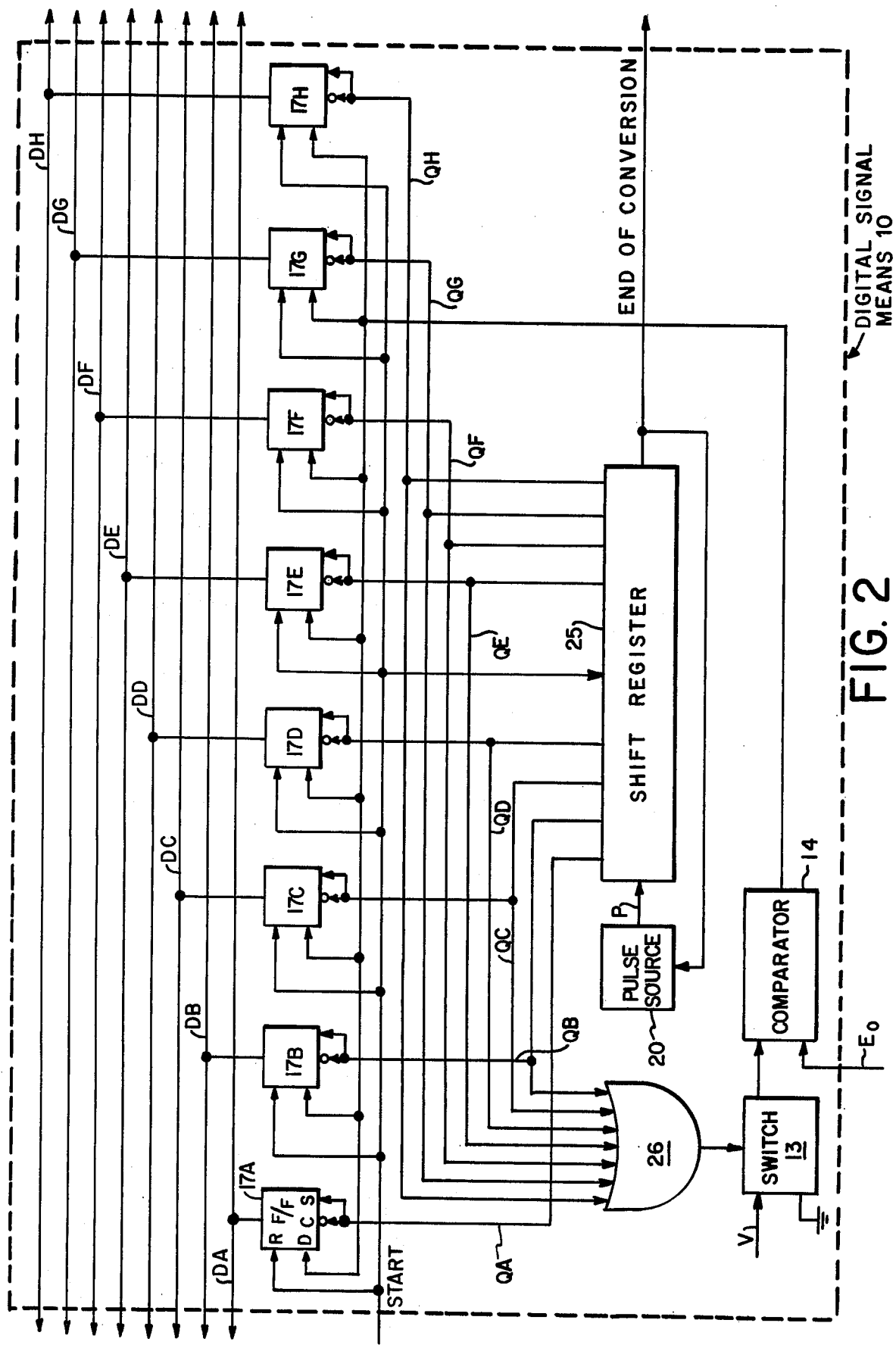
FIG. 2 is a detailed block diagram of the digital signal means shown in FIG. 1.

Switches 5A through 5H are electronic switches which are equivalent to single pole, double throw switches. The output of each amplifier is connected to one input of a corresponding switch having the same suffix as the amplifier. Each amplifier with the exception of the input amplifier 3A has its input connected to the output of a switch having a suffix which precedes its own suffix by one letter. Each switch of switches 5B through 5H, has another input connected to the output of a switch having a suffix which precedes its own suffix by one letter. Another input of switch 5B has input signal $E_1$ applied to it. Thus the output of amplifier 3B and the other input of switch 5B are connected to the output of switch 5A. Each switch of switches 5A through 5H is controlled by a corresponding digital signal of digital signals DA through DH, having two letters; the latter letter corresponding to the suffix of the switch it controls. Switch 5H provides an analog signal $E_o$ which corresponds to input signal $E_i$. The digital signals are provided by digital signal means 10 which also provides them as digital outputs corresponding to the logarithm of input signal $E_i$. Digital signal means 10 provides an end of conversion signal and receives an external start signal. Referring to FIG. 2, an electronic single pole, double throw switch 13 in digital signal means 10 has a reference voltage V, of 1.044 v ts, although a voltage of 1.00 volts may be used, applied to one input and has another input connected to ground. Switch 13 is controlled, as hereinafter explained, to initially provide an output corresponding to a zero voltage and to provide the reference voltage V as an output thereafter. The output from switch 13 is provided to a comparator 14 where the output is compared with signal $E_o$ from switch 5H. When the output from switch 13 corresponds to a zero voltage, comparator 14 is in effect determining the polarity of input signal $E_i$.

Comparator 14 provides an output corresponding to the comparison to D inputs of a plurality of flip-flops 17A through 17H which provides digital signals DA through DH, respectively. Digital signal means 10 also includes a pulse source 20 providing pulses P to a shift register 25. Shift register 25 provides pulses QA through QH in sequence to C and S inputs of flip-flops 17A through 17H, respectively, so that as one Q pulse ends the next Q pulse starts. A received start signal is applied to reset input R of flip-flops 17A through 17H and to shift register 25 to reset the flip-flops and shift register 25. Shift register 25 also provides the end of conversion signal which disables pulse source 20 to prevent the further providing of Q pulses.

Pulses QB through QC are provided to an OR gate 26 whose output controls switch 13. OR gate 26 provides a low level output to switch 13 when register 25 does not provide pulses QB through QH. Thus, pulses QB through QH pass through OR gate 26 so that in effect, OR gate 26 provides a high level output to switch 13 causing switch 13 to pass reference voltage V to comparator 14.

In operation signal $E_1$ is applied to amplifier 3A and to switch 5A. When a start pulse is received by signal means 10, flip-flop 17A through 17H and shift register 25 are reset. The end of conversion output from shift register 25 goes to a low logic level which enables pulse source 20 to provide shift pulses P to register 25. The first pulse QA from shift register 25 is applied to the C and the S inputs of flip-flop 17A. Since, at this point, all of the digital signals DA through DH are at a low logic level, input signal $E_i$ passes through switches 5A through 5H and is provided as signal $E_o$ to comparator 14. Due to the operation of switch 13, comparator 14 compares it with ground which in effect determines its polarity.

When signal $E_i$ is positive, comparator 14 provides its output at a low logic level to the D input of switches 17A through 17H. Since the output from comparator 14 is at a low logic level, the termination of pulse QA from register 25 has no effect on flip-flop 17A so that digital signal DA remains at a low logic level. When input signal $E_i$ is negative, the output from comparator 14 is applied to flip-flop 17A at a high logic level and the termination of pulse QA triggers it to a set state. Flip-flop 17A provides digital signal DA at a high logic level indicating polarity of the input signal as being negative and controlling switch 5A to pass the output from amplifier 3A instead of input signal $E_i$. Since amplifier 3A is an inverting unity gain amplifier, its only effect is to invert signal $E_i$ so that for the remainder of the operation the output from switch 5H will be positive.

By way of example let us assume that signal $E_i$ corresponds to a value of a 0.01 volt. As noted before signal $E_i$ is passed through amplifier 3A to invert it. The output from amplifier 3A is passed by switch 5A to switch 5B and to amplifier 3B. Pulse QB causes flip-flop 17B to provide digital signal DB at a low level output so that switch 5B passes the output from amplifier 3B. The amplifier output is passed through all of the remaining switches 5C through 5H so that output $E_o$ has a value of 2.56. Since pulse QB also causes switch 13 to pass reference voltage V to comparator 14. Since $E_o$ is greater than the reference voltage, comparator 14 provides its output at a high level so that upon the termination of pulse QB flip-flop 17B flips back to its previous state so that the signal is not amplified by amplifier 3B. Upon the occurrence of the pulse QC, switch 5 is controlled by signal DC to pass the amplified output of amplifier 3C which corresponds to 0.16 volts which pass through the remaining switches 5D through 5H and 13 to comparator 14. Since 0.16 is less than the reference voltage the output from the comparator 14 goes to a low level so that when pulse QC is terminated flip-flop 17C remains in the same state and switch 5C continues to pass the amplified signals from amplifier 3C. The sequence is continued and we will find that upon the completion of the sequence the following digital signals would be at a high level DC, DD, DF and DH which correspond to the word 10110.101 which in turn corresponds to the value of $-6.6438$. The converter gives the correct results for the best seven digit representation. Upon the completion of pulse QH from shift register 25, register 25 provides an end of conversion signal at a high level which is also applied to pulse source 20 disabling it to stop the pulses from being applied to shift register 25.

The apparatus of the present invention as hereinbefore described is a logarithmic analog-to-digital converter. The converter includes a programmable amplifier providing an analog signal in accordance with digital signals corresponding to an input signal. The converter of the present invention may be used to replace, or lieu of, the combination of a floating point amplifier and a linear analog-to-digital converter. What is claimed is:

1. A logarithmic analog-to-digital converter comprising receiving means for receiving an analog signal, programmable amplifier means connected to the receiving means and responsive to digital signals for providing an analog signal, and corresponding to a received analog signal, said programmable amplifier means includes a plurality of amplifiers having a first amplifier and a last amplifier, each amplifier having an input, an output and a different predetermined fixed gain of unity or greater; and said first amplifier having its input connected to the receiving means; and a plurality of switching means, having a first switching means and a last switching means, each switching means having two inputs and one output and being controlled by a different digital signal from the digital signal means to pass a signal applied to one input from the one input to the output or to pass another signal applied to the other input from the other input to the output, the one input of each means being connected to the output of a corresponding amplifier and the other input of each switching means, except the first switching means, being connected to the output of a corresponding switching means, the other input of the first switching means being connected to the receiving means, and the output of the last switching means being connected to the digital signal means, so that all the switching means control the amplification of a received analog signal; and digital signal means connected to the programmable amplifier means for providing the digital signals to the programmable amplifier means and as digital outputs corresponding logarithmically to the received analog signal in accordance with the analog signal from the programmable amplifier means, said digital signal means includes a pulse generator providing a pulse signal when an end of conversion signal is at a low logic level and not providing pulses when the end of conversion signal is at a high logic level, a shift register connected to the pulse source and responsive to the pulse signal for providing a plurality of pulses occurring in sequence and providing the end of conversion signal at a low level while providing the pulses and providing the end of conversion signal at a high logic level upon the completion of a sequence, a comparator receiving the analog signal from the programmable amplifier means, switching means connected to the shift register, to the comparator and to ground and receiving a reference voltage for providing a ground connection to the comparator during the occurrence of a first pulse provided by the shift register during the sequence and providing the reference voltage to the comparator during the occurrence of the remaining pulses provided by the shift register, a plurality of flip-flop means, each flip-flop means being connected to the shift register for being responsive to a different pulse provided by the shift register and to the output from the comparator to provide a digital signal to a corresponding switching means in the programmable amplifier so that upon the completion of a sequence the plurality of flip-flop means provides digital signals corresponding logarithmically to the analog input signal.

2. A converter as described in claim 1 in which the digital means include means for receiving a start pulse connected to the flip-flops for the initiation of a conversion sequence.

3. A converter as described in claim 2 in which the plurality of amplifiers comprises eight amplifiers arranged by their gains so that the first, amplifier through the last amplifier has gains of 1,256, 16,4,2,1, 1.414, 1.189 and 1.0905, respectively.

4. A converter as described, in claim 2 in which the plurality of amplifiers comprises eight amplifiers arranged by their gain so that the first amplifier through the last amplifier has gains of 256, 16, 4,2,1, 1.414, 1.189, 1.0905 and 1, respectfully.

* * * * *